(12) United States Patent
Sakaguchi et al.

(10) Patent No.: US 7,808,176 B2
(45) Date of Patent: Oct. 5, 2010

(54) DISPLAY UNIT

(75) Inventors: Masayki Sakaguchi, Aichi (JP); Yasuhiro Kanaya, Tokyo (JP); Toshiaki Yamaguchi, Aichi (JP); Shinji Kubota, Aichi (JP); Kazunari Takagi, Tokyo (JP); Akira Yumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 577 days.

(21) Appl. No.: 11/634,268

(22) Filed: Dec. 6, 2006

(65) Prior Publication Data

US 2007/0153208 A1 Jul. 5, 2007

(30) Foreign Application Priority Data

Dec. 8, 2005 (JP) ............................ P2005-354527

(51) Int. Cl.
*H01J 1/62* (2006.01)
(52) U.S. Cl. ..................... 313/506; 313/509; 313/512
(58) Field of Classification Search .......... 313/498–512
See application file for complete search history.

(56) References Cited

U.S. PATENT DOCUMENTS

2003/0233886 A1* 12/2003 Uramachi et al. ........ 73/861.08
2005/0242719 A1* 11/2005 Park ............................ 313/504

FOREIGN PATENT DOCUMENTS

| JP | 57-061243 A | 4/1982 |
| JP | 01-281432 A | 11/1989 |
| JP | 09-033933 A | 2/1997 |
| JP | 09-033941 A | 2/1997 |
| JP | 2000-275671 A | 10/2000 |
| JP | 2000-347173 A | 12/2000 |
| JP | 2005-38633 | 2/2005 |
| JP | 2005-227313 A | 8/2005 |
| JP | 2006-178368 A | 7/2006 |

OTHER PUBLICATIONS

Japanese Office Action issued Jul. 1, 2009 for corresponding Japanese Application No. 2005-354527.
Japanese Office Action issued Apr. 15, 2010 for corresponding Japanese Application No. 2010-004031.

* cited by examiner

*Primary Examiner*—Bumsuk Won
(74) *Attorney, Agent, or Firm*—Christopher M. Tobin

(57) ABSTRACT

A display unit capable of preventing corrosion of a metal wiring and improving the reliability is provided. The display unit includes a driving panel having a bonding region and a terminal region on a driving substrate and a sealing panel bonded on the bonding region of the driving panel with an adhesive layer in between. The bonding region includes a circuit section, a coating layer covering the circuit section, and a display portion composed of a plurality of display devices. A plurality of metal wirings is electrically connected to the circuit section in the bonding region and extended to the terminal region. The coating layer has at least one separated region between the plurality of metal wirings.

8 Claims, 21 Drawing Sheets

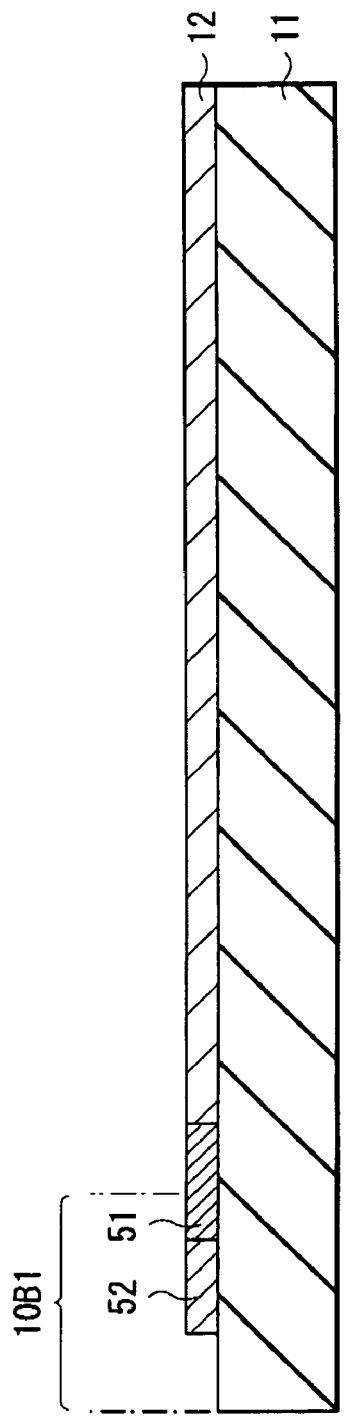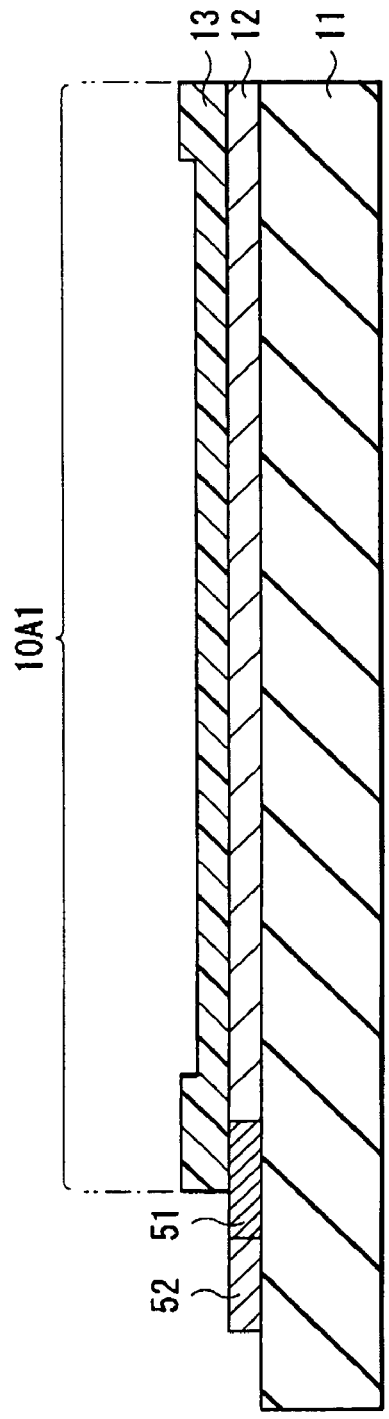

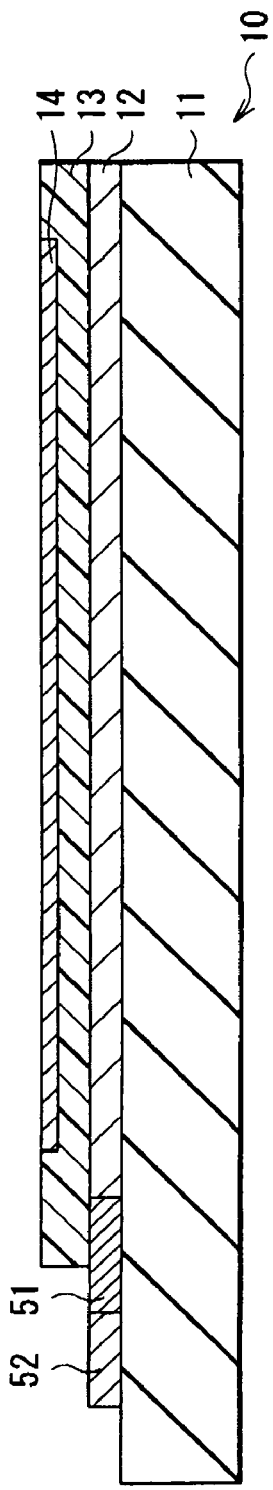
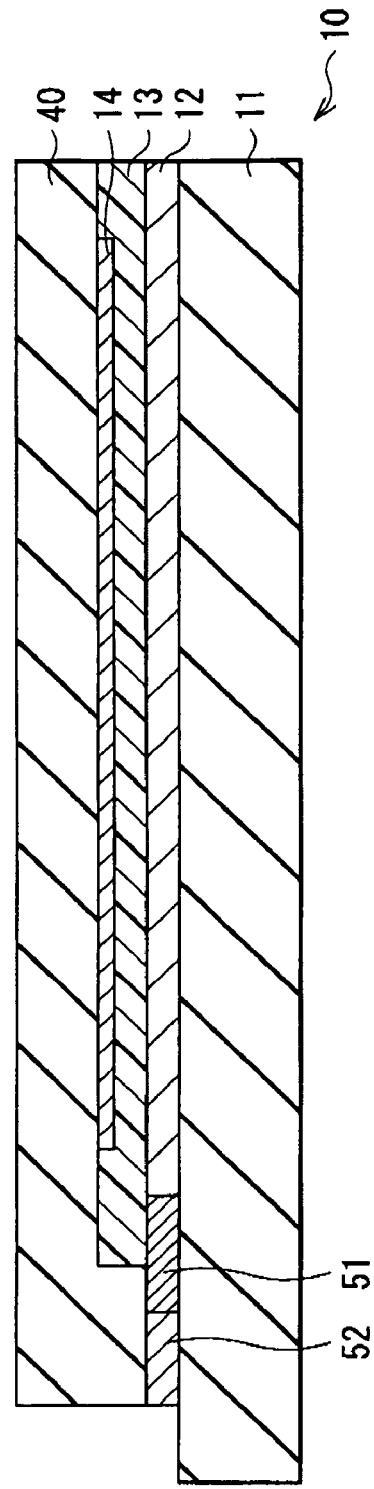
FIG. 7A
FIG. 7B

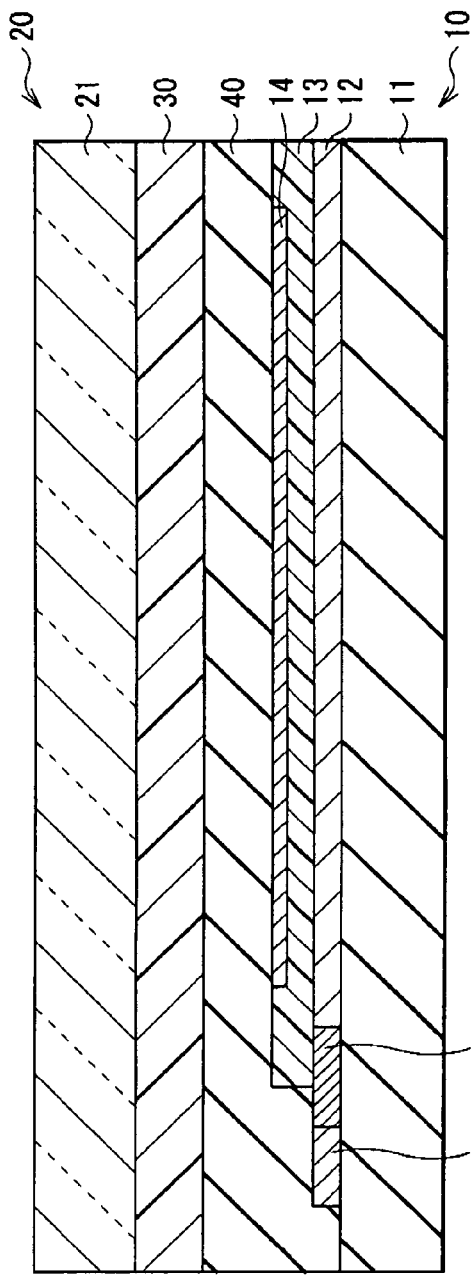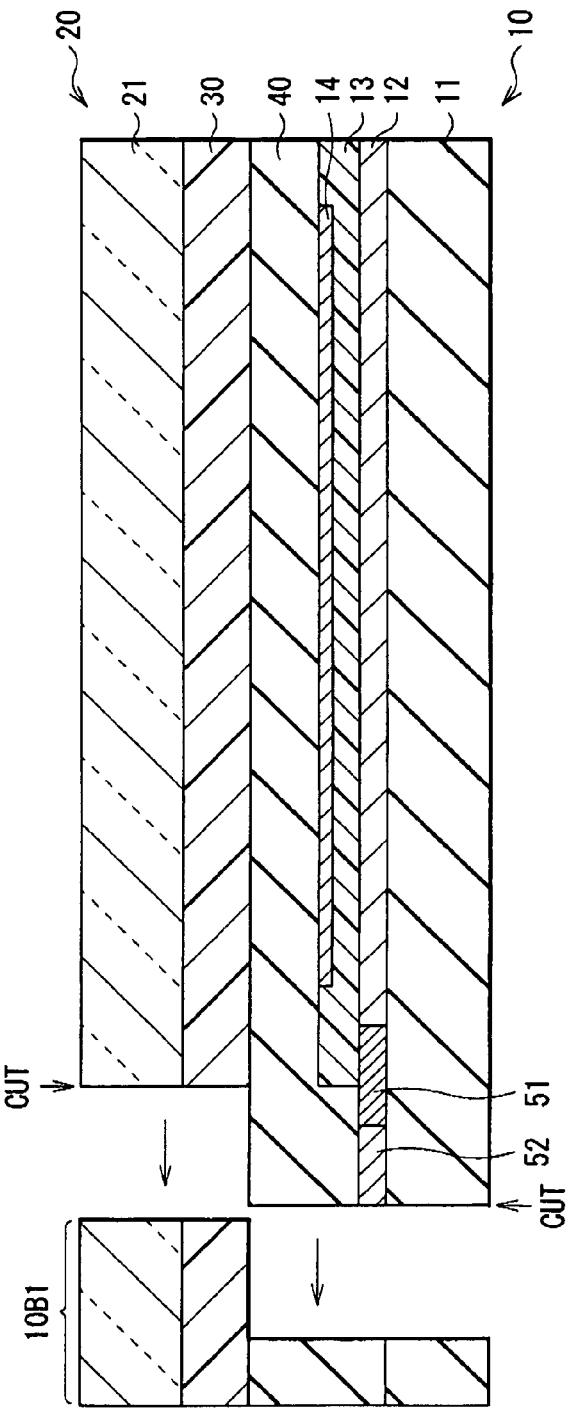
FIG. 8A
FIG. 8B

DISPLAY UNIT

CROSS REFERENCES TO RELATED APPLICATIONS

The present invention contains subject matter related to Japanese Patent Application JP 2005-354527 filed in the Japanese Patent Office on Dec. 8, 2005, the entire contents of which are incorporated herein by reference.

BACKGROUND OF THE INVENTION

1. Field of the Invention

The present invention relates to a display unit using display devices, such as organic light-emitting devices, and particularly to a display unit of a so-called completely solid sealing structure in which a driving panel provided with the display devices and a sealing panel are bonded with an adhesive layer in between.

2. Description of the Related Art

In recent years, as a display unit displacing a liquid crystal display, an organic light emitting display unit using organic light-emitting devices, has been noted. FIG. 19 and FIG. 20 show an example of the structure of the organic light-emitting display unit. In the display unit, a driving panel 210 and a sealing panel 220 are oppositely arranged and bonded with an adhesive layer 230 in between.

In the driving panel 210, a circuit section 212, a coating layer 213, and a display portion 214 composed of a plurality of organic light emitting devices are sequentially formed on a driving substrate 211 made of glass or the like. The sealing panel 220 has a sealing substrate 221 made of glass or the like. To seal the display portion 214 from the air, an inorganic insulating film 240 made of silicon nitride ($SiN_x$), silicon dioxide ($SiO_2$) or the like is provided between the display portion 214 side of the driving panel 210 and the adhesive layer 230 (for example, refer to Japanese Unexamined Patent Application Publication No. 2005-38633).

The circuit section 212, the coating layer 213, and the display portion 214 are provided in a bonding region 200A where the driving panel 210 and the sealing panel 220 are bonded. One side of the driving panel 210 is a terminal region 200B protruding from the sealing panel 220. In the terminal region 200B, a metal wiring 251 is extended from the circuit section 212. A terminal 252 is provided on the tip of the metal wiring 251. The metal wiring 251 and the terminal 252 are made of a low-resistance metal, such as aluminum (Al).

SUMMARY OF THE INVENTION

In such a display unit of related art, as shown in FIG. 21, the metal wiring 251 is coated with the continuous coating layer 213 in the bonding region 200A. The coating layer 213 is made of an organic insulating material. Therefore, the coating layer 213 easily absorbs moisture and has low contact characteristics with the inorganic insulating film 240. Therefore, a boundary 200C between the bonding region 200A and the terminal region 200B is easily affected by moisture under the high moisture vapor pressure environment. As a result, moisture and impurity ions enter through the coating layer 213 or through the interface between the coating layer 213 and the inorganic insulating film 240. This causes an electric potential difference between the metal wirings 251. As a result, corrosion is generated in the metal wiring 251, leading to breaking and short circuiting.

A factor effecting the electric field corrosion of the metal wiring 251, may include, for example, the material used for the metal wiring 251, ion exchange path such as moisture and an electric fields generated between adjacent metal wirings 251, the like can be cited. In the past, for example, as described in Japanese Unexamined Patent Application Publication No. H11-142871, it is proposed that the influence, of the electric potential between the adjacent wirings, which is one of the factors generating the electric field corrosion, is minimized by the method as follows. That is, the array order of the wirings arranged in parallel is set so that the electric potential difference between the adjacent wirings is minimized, and a dummy wiring is further provided. However, in the structure of the display unit of the related art as shown in FIG. 21, moisture and impurity ions freely enter between the metal wirings 251 through the coating layer 213. Therefore, it has been difficult to avoid the corrosion even when the electric potential difference between the adjacent wirings is very small.

In view of the foregoing, in the invention, it is desirable to provide a display unit capable of preventing the corrosion of the metal wiring and improving the reliability.

According to an embodiment of the invention, there is provided a first display unit including a driving panel having a bonding region and a terminal region on a driving substrate and a sealing panel bonded on the bonding region of the driving panel with an adhesive layer in between, wherein the bonding region includes a circuit section, a coating layer covering the circuit section, and a display portion composed of a plurality of display devices, a plurality of metal wirings are electrically connected to the circuit section in the bonding region and extended to the terminal region, and the coating layer has at least one separated region between the plurality of metal wirings.

In the first display unit, the coating layer in the bonding region has the separated region between the plurality of metal wirings. Therefore, moisture and impurity ions are prevented from entering between the adjacent metal wirings through the coating layer.

According to an embodiment of the invention, there is provided a second display unit including a driving panel having a bonding region and a terminal region on a driving substrate and a sealing panel bonded on the bonding region of the driving panel with an adhesive layer in between, wherein the bonding region includes a circuit section, a coating layer covering the circuit section, and a display portion composed of a plurality of display devices, and a plurality of metal wirings are electrically connected to the circuit section in the bonding region, extended to the terminal region, and coated with the coating layer on the terminal region side rather than a boundary between the terminal region and the bonding region.

In the second display unit, the plurality of metal wirings are coated with the coating layer on the terminal region side rather than the boundary between the terminal region and the bonding region. Therefore, moisture and impurity ions are prevented from entering from the boundary into the bonding region through the coating layer.

According to the first display unit of the embodiment of the invention, at least one separated region is provided between the plurality of metal wirings in the coating layer in the bonding region. Therefore, moisture and impurity ions can be prevented from entering between the adjacent metal wirings through the coating layer. As a result, corrosion of the metal wiring is prevented, and the reliability of the display unit can be largely improved.

According to the second display unit of the embodiment of the invention, the plurality of metal wirings is coated with the coating layer on the terminal region side rather than the boundary between the terminal region and the bonding region. Therefore, moisture and impurity ions can be prevented from entering from the boundary into the bonding region through the coating layer. As a result, corrosion of the metal wiring is prevented, and the reliability of the display unit can be largely improved.

Other and further objects, features and advantages of the invention will appear more fully from the following description.

BRIEF DESCRIPTION OF THE DRAWINGS

FIGS. 6A and 6B are views showing a method of manufacturing the display unit shown in FIG. 1 in the order of steps;

FIGS. 7A and 7B are views showing the steps following FIGS. 6A and 6B;

FIGS. 8A and 8B are views showing the steps following FIGS. 7A and 7B;

DETAILED DESCRIPTION OF THE PREFERRED EMBODIMENTS

Embodiments of the invention will be described hereinafter in detail with reference to the drawings. For each element in the figures, the shape, the size, and the arrangement relation with which the invention can be understood are schematically shown. Therefore, the dimensions thereof are different from the actual dimensions.

First Embodiment

Figure 1:
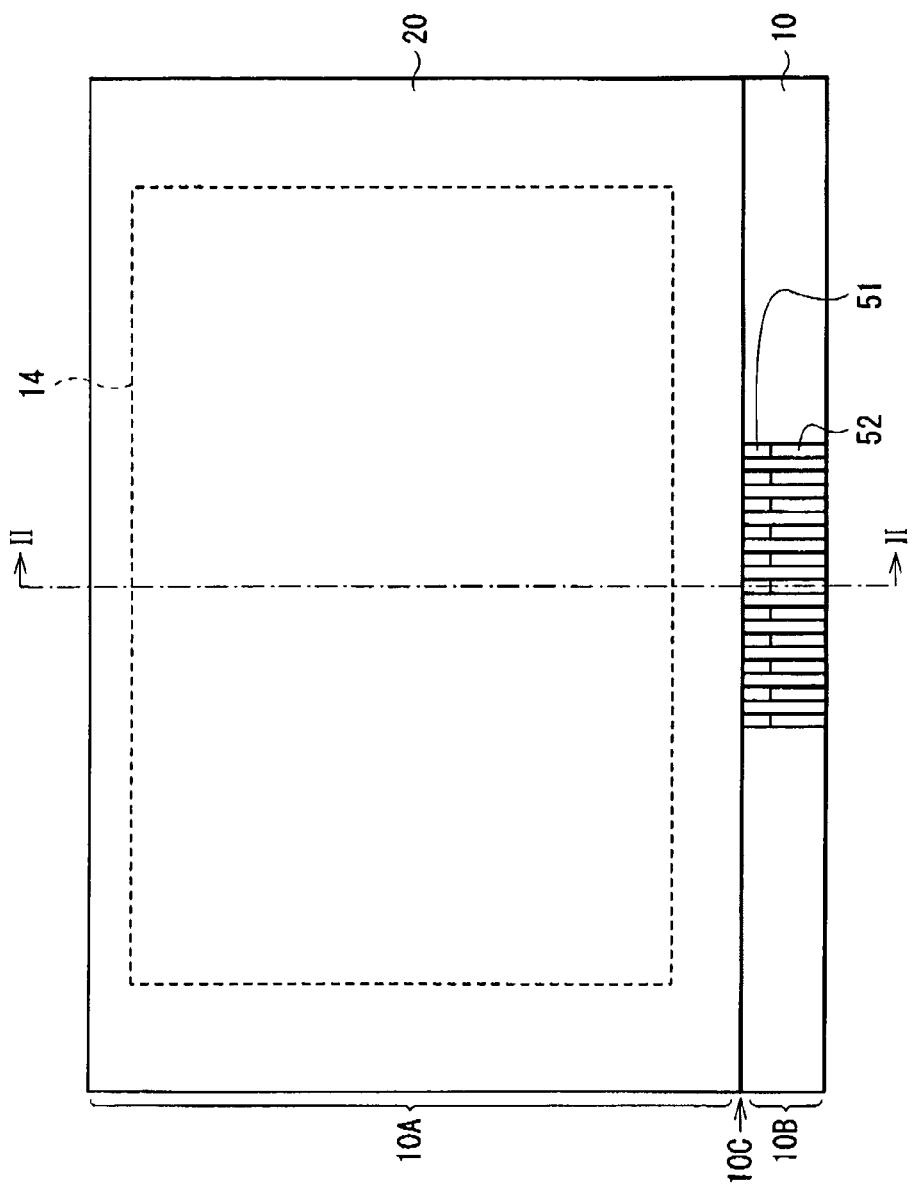
FIG. 1 is a plan view showing a schematic structure of a display unit according to a first embodiment of the invention.
Figure 2:
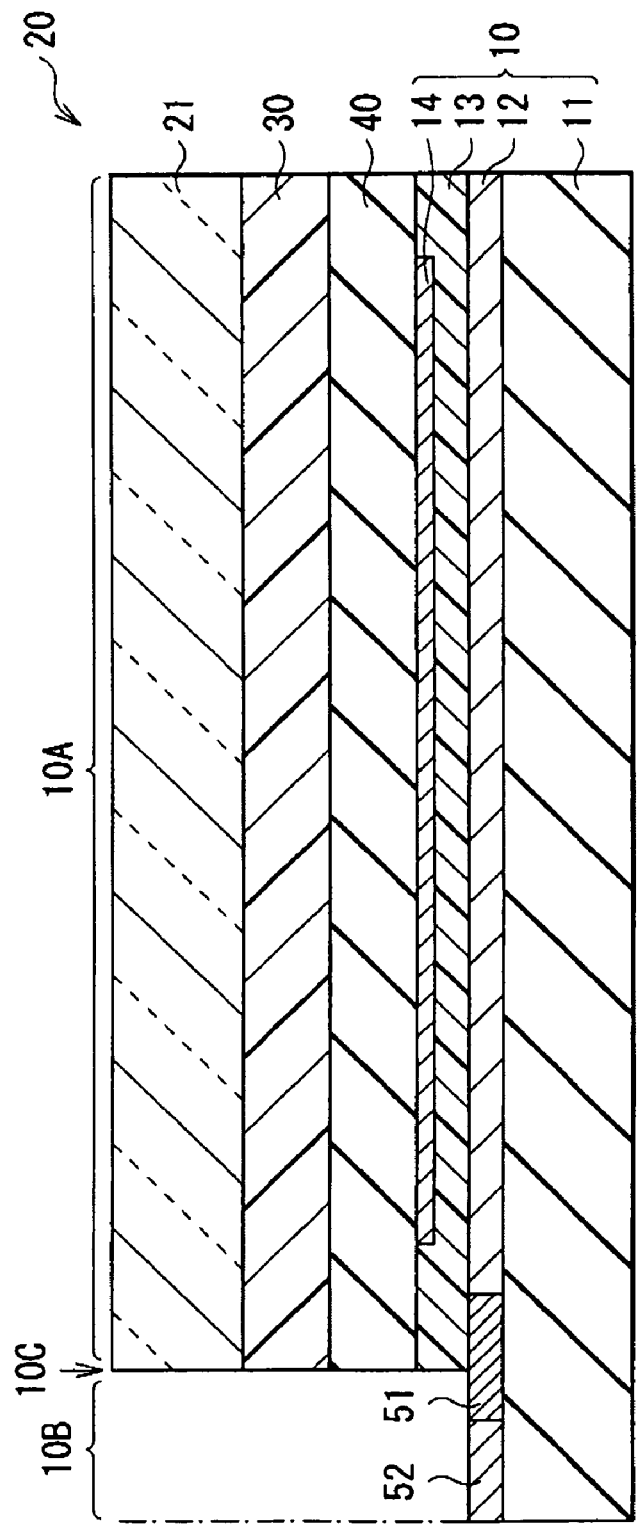
FIG. 2 is a cross section taken along line II-II of the display unit shown in FIG. 1.

FIG. 1 shows a schematic structure of a display unit according to a first embodiment of the invention. FIG. 2 shows a cross sectional structure taken along line II-II of the display unit shown in FIG. 1. The display unit is used as an active-type/passive-type ultrathin organic light-emitting display unit driven by a TFT (Thin Film Transistor), for example. The display unit has a structure in which a driving panel 10 and a sealing panel 20 are arranged oppositely and bonded with an adhesive layer 30 in between.

In the driving panel 10, a circuit section 12, a coating layer 13, and a display portion 14 composed of a plurality of organic light-emitting devices described later are sequentially formed on a driving substrate 11 made of an inorganic insulating material, such as glass. To seal the display portion 14 from the air, an inorganic insulating film 40 made of silicon nitride ($SiN_x$), silicon dioxide ($SiO_2$) or the like is provided between the display portion 14 side of the driving panel 10 and the adhesive layer 30.

The circuit section 12 includes a driving circuit having a TFT or the like for driving each organic light-emitting device of the display portion 14 and a peripheral circuit provided on the periphery of the display portion 14 (both are not shown).

The coating layer 13 is, for example, about 0.2 μm to 50 μm thick, and is made of an organic photosensitive material such as polyimide, polyamide, acrylic, BCB (benzocyclobutene), and polyimideamide.

The circuit section 12, the coating layer 13, and the display portion 14 are provided in a bonding region 10A where the driving panel 10 and the sealing panel 20 are bonded. One side of the driving panel 10 is a terminal region 10B protruding from the sealing panel 20. In the terminal region 10B, a plurality of metal wirings 51 electrically connected to the peripheral circuit of the circuit section 12 are extended. A terminal 52 is provided on the tip of each of the metal wirings 51. The metal wiring 51 is preferably made of a material with low resistance and superior reflectance and workability. For example, the metal wiring 51 is preferably made of aluminum (Al) or an alloy containing aluminum (Al) about 50 nm to 5 thick. Specifically, an alloy of aluminum (Al) and titanium (Ti), silicon (Si), molybdenum (Mo), copper (Cu), chromium (Cr), nickel (Ni), palladium (Pd), platinum (Pt), tungsten (W) or the like can be cited. Further, the metal wiring 51 may have a structure in which the foregoing materials are layered.

Figure 3:
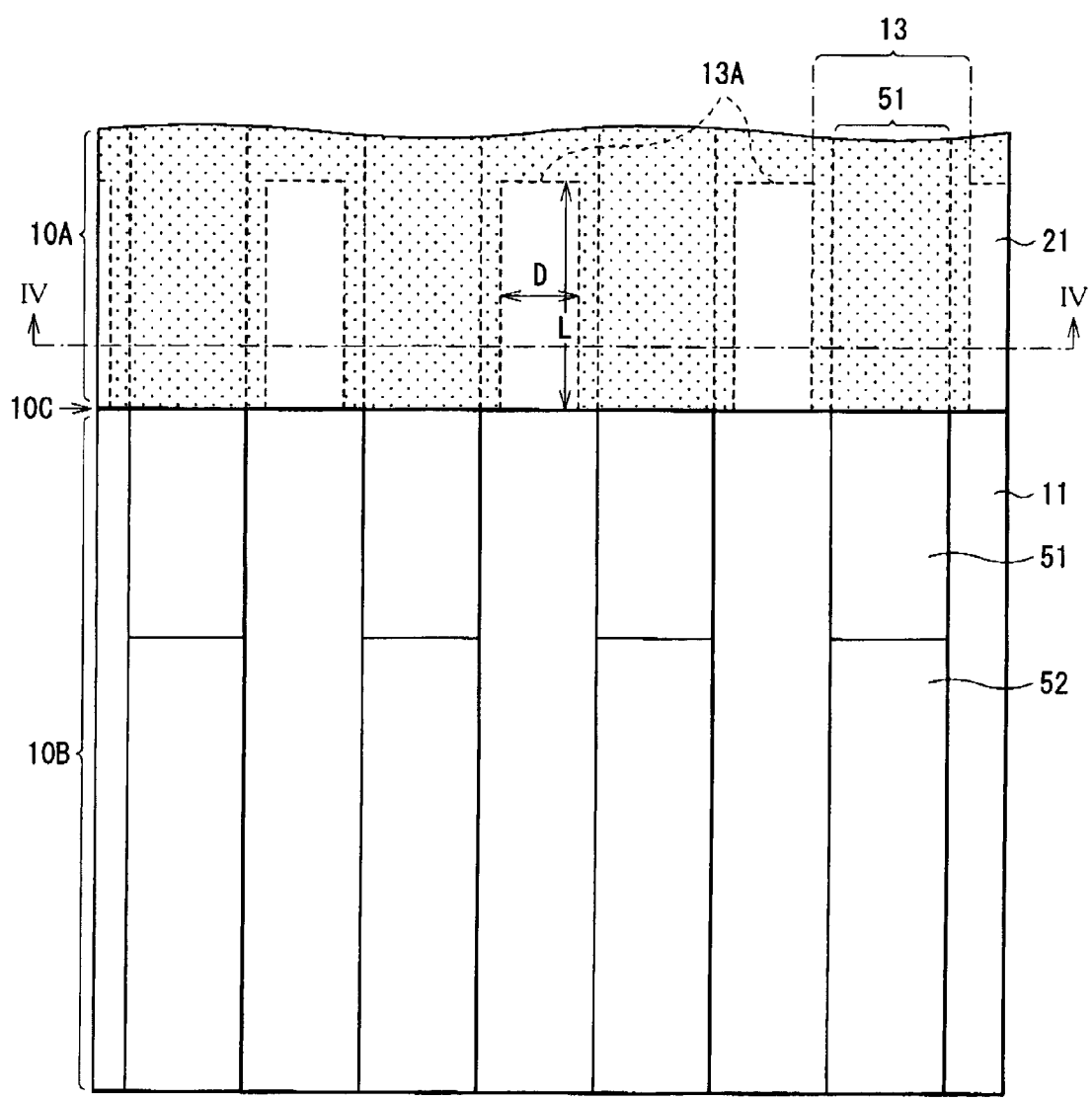
FIG. 3 is a plan view showing an enlarged part in the vicinity of a boundary of the display unit shown in FIG. 1.
Figure 4:
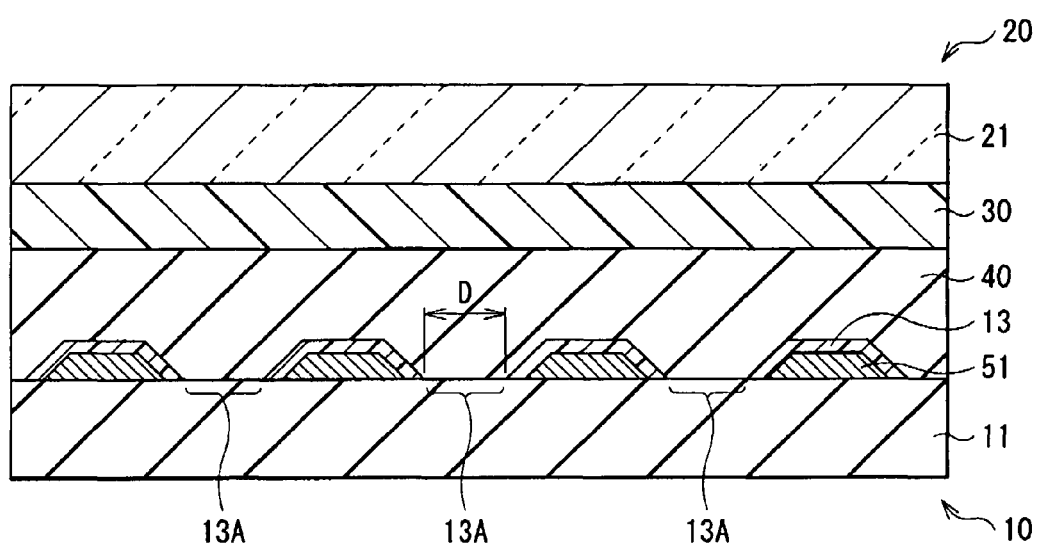
FIG. 4 shows a cross section taken along line IV-IV of FIG. 3.

FIG. 3 shows a structure in plan view in the vicinity of a boundary 10C between the bonding region 10A and the terminal region 10B. FIG. 4 shows a cross sectional structure taken along line IV-IV of FIG. 3. The coating layer 13 has an inter-wiring separated region 13A between the adjacent metal wirings 51 in the bonding region 10A. Thereby, in the display unit, corrosion of the metal wiring 51 is prevented, and the reliability of the display unit can be largely improved. In FIG. 3, the region where the coating layer 13 is formed is shown as a half-tone dot meshing area.

The coating layer 13 preferably coats the top face and the side faces of the plurality of metal wirings 51. Thereby, it is possible to prevent the metal wiring 51 from being short-circuited or being damaged from external force due to a foreign body attached to the metal wiring 51 in the manufacturing steps.

The inorganic insulating film 40 is preferably contacted with the driving substrate 11 between the plurality of metal wirings 51. As described above, the driving substrate 11 is made of the inorganic material such as glass. Therefore, the contact characteristics between the inorganic insulating film 40 and the driving substrate 11 can be improved. As a result, moisture or impurity ions can be prevented from entering between the metal wirings 51 through the boundary 10C between the bonding region 10A and the terminal region 10B.

The width D of the inter-wiring separated region 13A, that is, the dimension of the inter-wiring separated region 13A in the array direction of the metal wiring 51, is preferably wide as much as possible according to the distance between the adjacent metal wirings 51. The length L of the inter-wiring separated region 13A is desirably long as much as possible in the direction along the metal wiring 51.

The sealing panel 20 shown in FIG. 1 and FIG. 2 is located on the display portion 14 side of the driving panel 10. The sealing panel 20 has a sealing substrate 21 which seals organic light-emitting devices 110R, 110G, and 110B together with an adhesive layer 30. The sealing substrate 21 is made of a material, such as glass, transparent to light generated in the organic light-emitting devices 110R, 110G, and 110B. The sealing substrate 21 is provided with a color filter (not shown). The color filter extracts the light generated in the organic light emitting devices 110R, 110G, and 110B, absorbs outside light reflected by the organic light-emitting devices 110R, 110G, and 110B and the wiring therebetween, and improves the contrast.

The adhesive layer 30 is made of, for example, a thermosetting resin or an ultraviolet curable resin.

Figure 5:
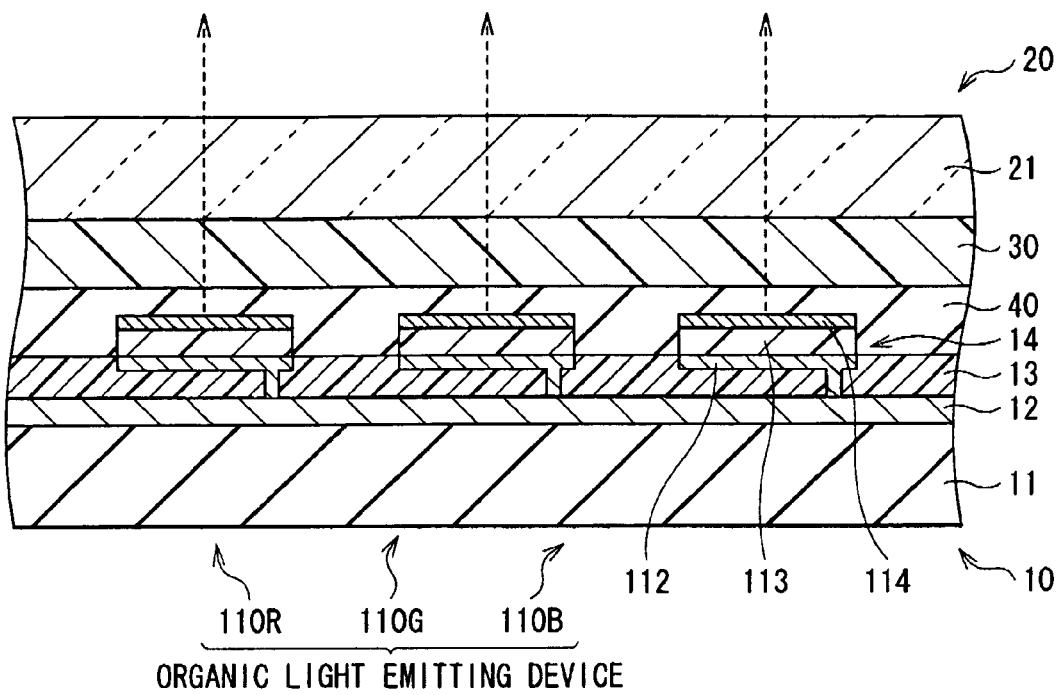
FIG. 5 is a cross section showing an example of a display portion shown in FIG. 2.

FIG. 5 shows an example of a structure of the display portion 14. In the display portion 14, the organic light-emitting device 110R generating red light, and the organic light-emitting device 110G generating green light, the organic light-emitting device 110B generating blue light are sequentially provided in a matrix state as a whole on the coating layer 13.

In the organic light-emitting devices 110R, 110G, and 110B, for example, a first electrode 112 as an anode, an organic layer 113 including a light-emitting layer, and a second electrode 114 as a cathode are layered in this order from the driving substrate 11 side.

The first electrode 112 also functions as a reflection layer, and is, for example, made of a metal or an alloy of platinum (Pt), gold (Au), chromium (Cr), silver (Ag), tungsten (W) or the like. The first electrode 112 is connected to the driving circuit of the circuit section 12 through the contact hole (not shown) provided in the coating layer 13.

The structure of the organic layer 113 varies according to the emission colors of the organic light-emitting devices. The organic layer 113 of the organic light-emitting devices 110R and 110B has a structure in which a hole transport layer, a light-emitting layer, and an electron transport layer are layered in this order from the first electrode 112 side. The organic layer 113 of the organic light-emitting device 110G has a structure in which the hole transport layer and the light-emitting layer are layered in this order from the first electrode 112 side. The hole transport layer is provided to improve hole injection efficiency to the light-emitting layer. The light-emitting layer is provided to generate light due to current injection. The electron transport layer is provided to improve hole injection efficiency to the light-emitting layer.

As a material of the hole transport layer of the organic light-emitting device 110R, for example, bis[(N-naphthyl)-N-phenyl]benzidine (a -NPD) can be cited. As a material of the light-emitting layer of the organic light-emitting device 110R, for example, 5-bis [4-[N-(4-methoxyphenyl)-N-phenylamino]]styrilbenzen-1,4-dicarbonitrile (BSB) can be cited. As a material of the electron transport layer of the organic light-emitting device 110R, for example, 8-quinolinole aluminum complex ($Alq_3$) can be cited.

As a material of the hole transport layer of the organic light-emitting device 110B, for example, $\alpha$-NPD can be cited. As a material of the light-emitting layer of the organic light-emitting device 110B, for example, 4,4-bis(2,2-diphenylvinyl)biphenyl (DPVBi) can be cited. As a material of the electron transport layer of the organic light-emitting device 110B, for example, $Alq_3$ can be cited.

As a material of the hole transport layer of the organic light-emitting device 110G, for example, $\alpha$-NPD can be cited. As a material of the light emitting layer of the organic light-emitting device 110G, for example, a substance obtained by mixing 1 volume % of coumarin 6 (C6) with $Alq_3$ can be cited.

The second electrode 114 is made of a semi-transmissive electrode. The light generated in the light-emitting layer is extracted from the second electrode 114 side. The second electrode 114 is made of a metal or an alloy of silver (Ag), aluminum (Al), magnesium (Mg), calcium (Ca), sodium (Na) or the like.

The display unit can be manufactured, for example, as follows.

FIG. 6A to FIG. 8B show a method of manufacturing the display unit in the order of steps. First, as shown in FIG. 6A, the circuit section 12 including the driving circuit and the peripheral circuit is formed on the driving substrate 11 made of the foregoing material. The plurality of metal wirings 51 made of the foregoing material and having the foregoing thickness is extended from the circuit section 12 to a region 10B1 where the terminal region 10B is to be formed. The terminal 52 is provided on the tip of the metal wiring 51.

Next, as shown in FIG. 6B, the coating layer 13 having the foregoing thickness is formed by applying, exposing and developing the foregoing material by, for example, a spin coat method. When exposing, part of the coating layer 13 in a region 10A1 where the bonding region 10A is to be formed is removed. Thereby, the inter-wiring separated region 13A is provided between the adjacent metal wirings 51 (not shown in FIG. 6B; and refer to FIG. 3 and FIG. 4).

Subsequently, as shown in FIG. 7A, the display portion 14 is formed on the coating layer 13. When the display portion 14 is formed, first, the first electrode 112 made of the foregoing material is deposited by, for example, DC sputtering. Then, etching is made selectively by, for example, using a lithography technique to pattern in a given shape. After that, the organic layer 113 and the second electrode 114 respectively made of the foregoing material are sequentially deposited by, for example, a vapor deposition method to form the organic light-emitting devices 110R, 110G, and 110B as shown in FIG. 5. Thereby, the driving panel 10 is formed.

After that, as shown in FIG. 7B, the inorganic insulating film 40 made of the foregoing material is formed on the display portion 14.

After the driving panel 10 is formed, as shown in FIG. 8A, the adhesive layer 30 is formed on the inorganic insulating film 40. After that, as the sealing panel 20, the sealing substrate 21, which is made of the foregoing material and is provided with the color filter, is prepared. As shown in FIG. 8A, similarly, the driving panel 10 and the sealing panel 20 are bonded with the adhesive layer 30 in between.

After the driving panel 10 and the sealing panel 20 are bonded, as shown in FIG. 8B, the sealing panel 20 and adhesive layer 30 in the region 10B1 where the terminal region 10B is to be formed are cut and removed. After that, the inorganic insulating film 40 is removed by, for example, etching to expose the metal wiring 51 and the terminal 52. Thereby, the terminal region 10B and the bonding region 10A are formed. Consequently, the display unit shown in FIG. 1 to FIG. 5 is completed.

In the display unit, when a given voltage is applied between the first electrode 112 and the second electrode 114, a current is injected in the light emitting layer of the organic layer 113, electron-hole recombination occurs, and thereby light is generated. The light is extracted through the second electrode 114, the inorganic insulating film 40, and then the sealing panel 20. In this embodiment, the coating layer 13 has the inter-wiring separated region 13A between the metal wirings 51 in the bonding region 10A. Therefore, moisture and impurity ions are prevented from entering between the adjacent metal wirings 51 through the coating layer 13, and the reliability is improved.

As above, in this embodiment, the coating layer 13 has the inter-wiring separated region 13A between the adjacent metal wirings 51 in the bonding region 10A. Therefore, moisture and impurity ions can be prevented from entering between the adjacent metal wirings 51 through the coating layer 13. As a result, corrosion of the metal wiring 51 can be prevented, and the major troubles that the pixels are not lit due to short circuiting of the metal wiring 51 and basic performance is damaged can be prevented. As a result, the reliability of the display unit can be largely improved.

Further, the inter-wiring separated region 13A can be formed by the simple step in which the planar pattern is changed when exposing the coating layer 13. Therefore, different from providing additional layers, the structure and the manufacturing steps are not complicated. Thus, a highly-reliable display unit can be realized without an increased cost of the material or the like.

In particular, the inorganic insulating film 40 is contacted with the driving substrate 11 between the plurality of metal wirings 51. Therefore, the contact characteristics between the inorganic insulating film 40 and the driving substrate 11 made of the inorganic material, such as glass, can be improved. As a result, moisture or impurity ions can be prevented from entering between the metal wirings 51 through the boundary 10C between the bonding region 10A and the terminal region 10B.

A description will be given of first to fourth modifications of the first embodiment. The first to fourth modifications have a structure similar to that of the first embodiment, except that the shape or the arrangement of the coating layer 13 and the inter-wiring separated region 13A are changed, and can be manufactured similarly to in the first embodiment. The actions and the effects thereof are also similar to those of the first embodiment. Therefore, the description will be given by attaching the same symbols to the corresponding elements.

First Modification

Figure 9:
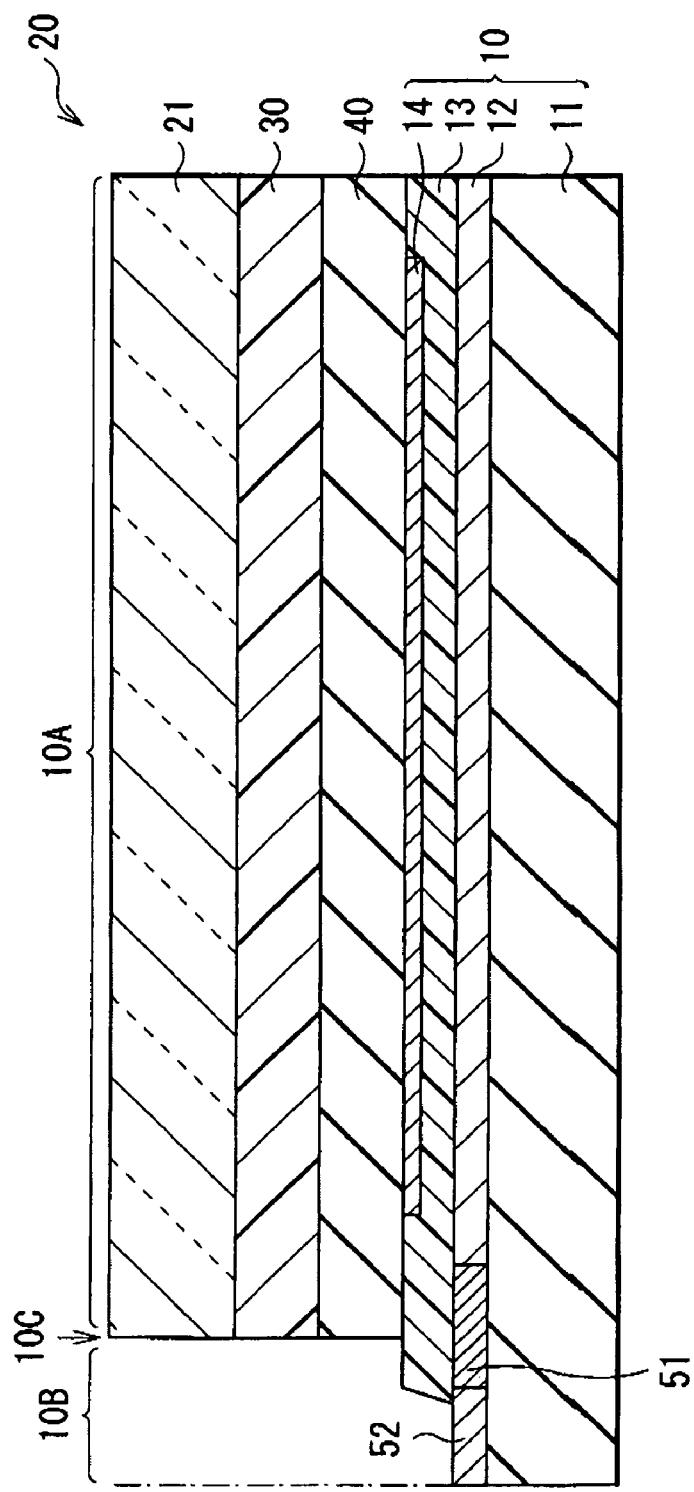
FIG. 9 is a cross section showing a structure of a display unit according to a first modification of the invention.
Figure 10:
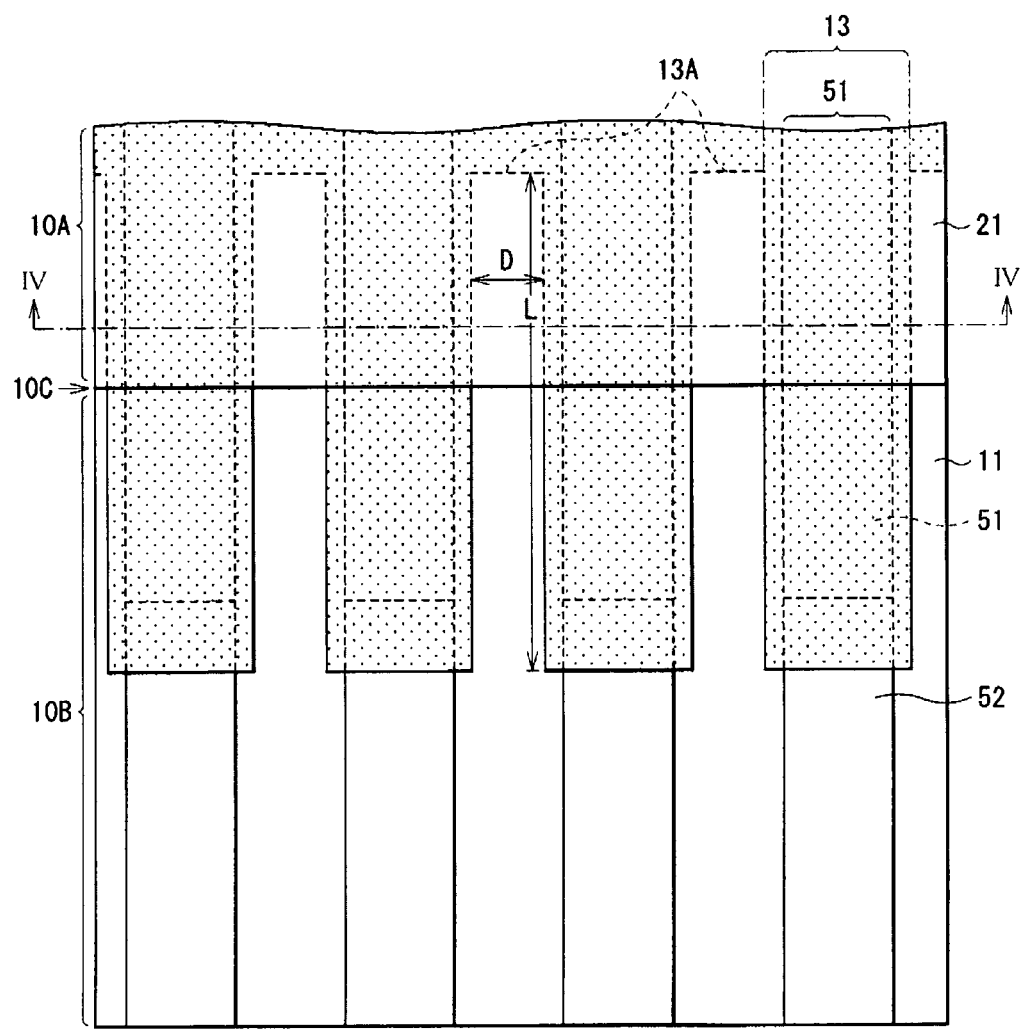
FIG. 10 is a plan view showing an enlarged part in the vicinity of a boundary of the display unit shown in FIG. 9.

FIG. 9 shows a cross-sectional structure of a display unit according to the first modification of the invention. FIG. 10 shows a planar structure in the vicinity of the boundary 10C. In the display unit, the coating layer 13 is provided in the bonding region 10A and in part of the terminal region 10B. The inter-wiring separated region 13A is provided in the terminal region 10B beyond the bonding region 10A. Thereby, in this modification, a deviation generated when the sealing panel 20 and the adhesive layer 30 in the region 10B1 where the terminal region 10B is to be formed are cut in the step shown in FIG. 8B can be absorbed.

Second Modification

Figure 11:
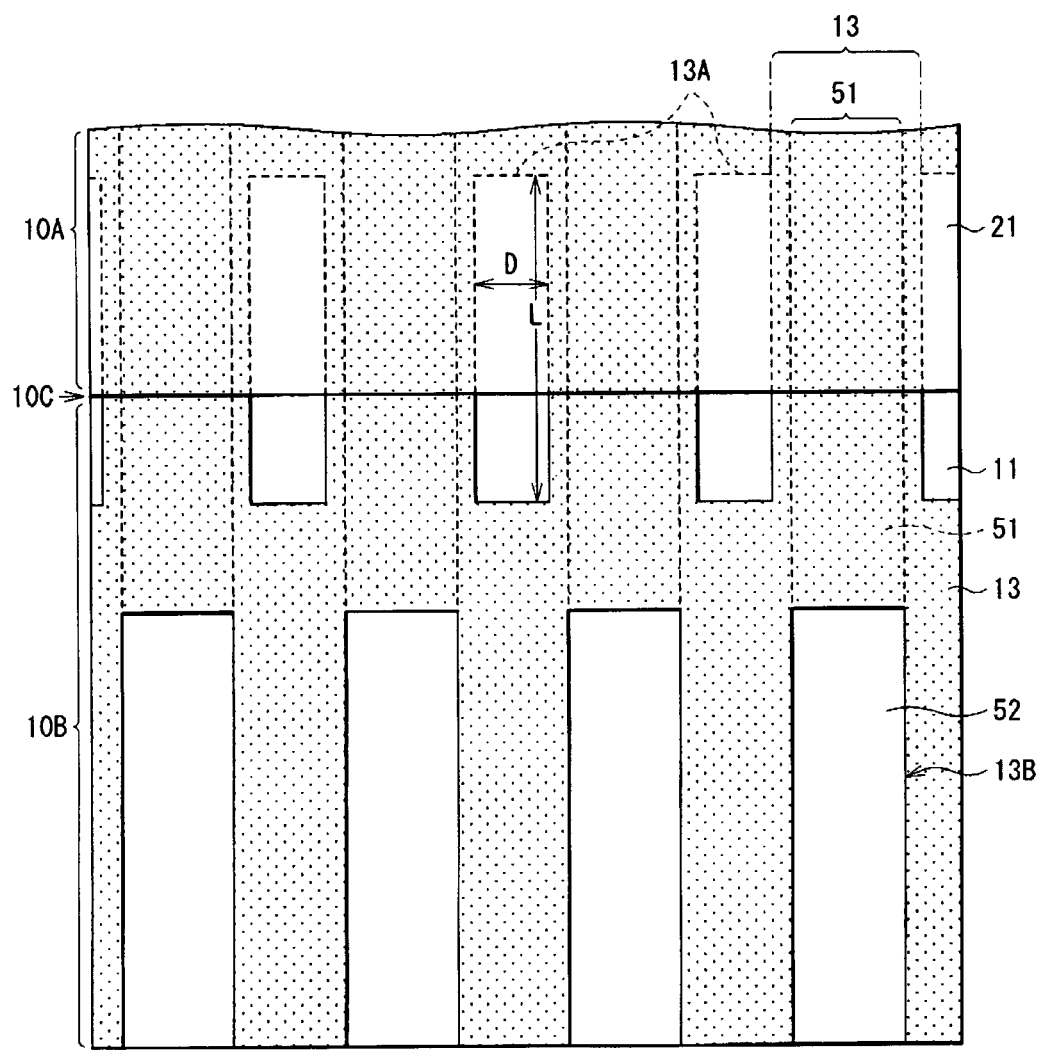
FIG. 11 is a plan view showing an enlarged part in the vicinity of a boundary of a display unit according to a second modification of the invention.

FIG. 11 shows a planar structure in the vicinity of the boundary 10C of a display unit according to the second modification of the invention. In the display unit, the coating layer 13 is provided on the whole area of the bonding region 10A and the terminal region 10B. In the coating layer 13, an aperture 13B is provided according to the terminal 52. In this modification, effects similar to those of the foregoing first modification can be obtained.

Third Modification

Figure 12:
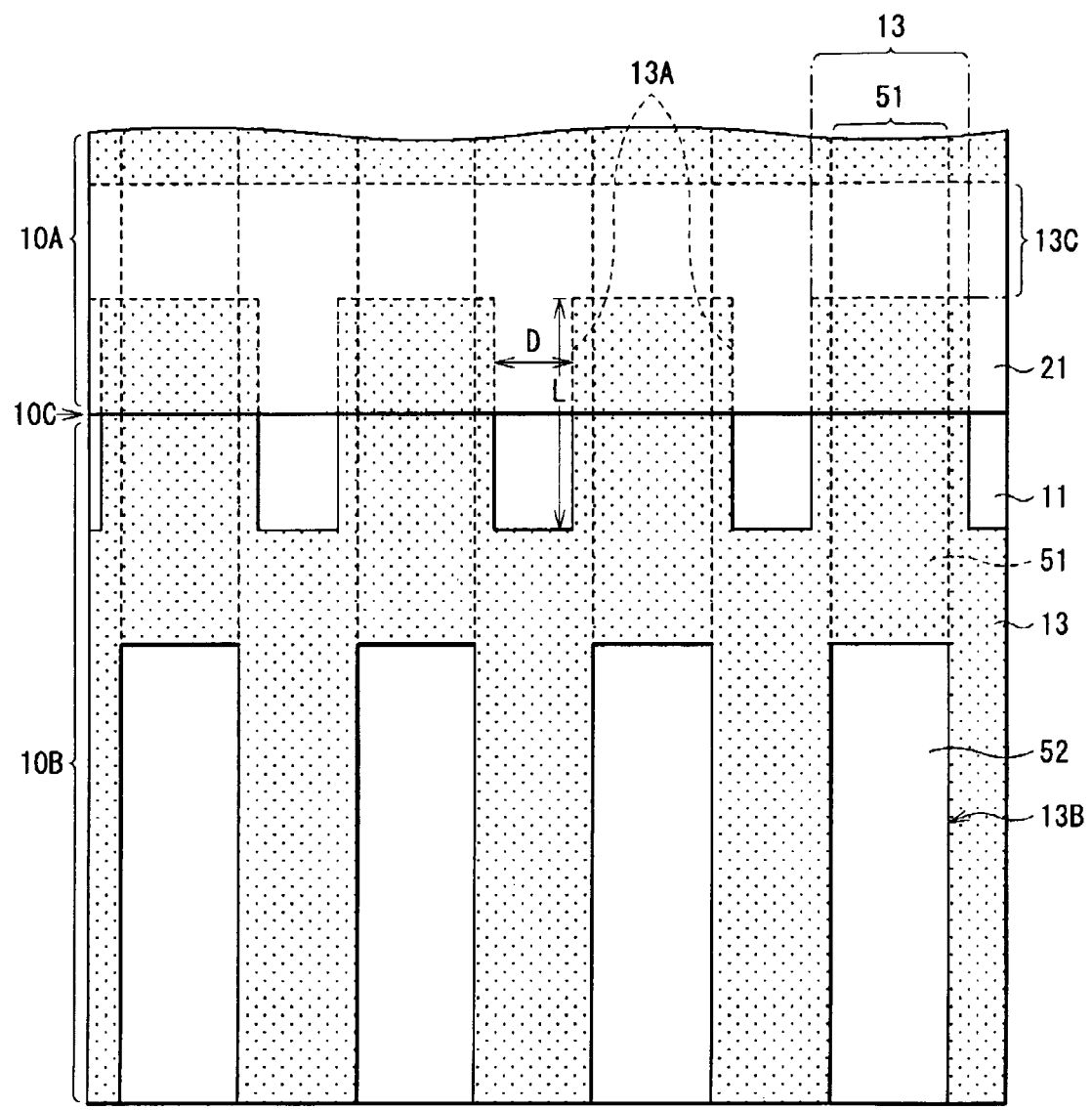
FIG. 12 is a plan view showing an enlarged part in the vicinity of a boundary of a display unit according to a third modification of the invention.

FIG. 12 shows a planar structure in the vicinity of the boundary 10C of a display unit according to the third modification of the invention. In the display unit, part of the coating layer 13 is removed to become a lateral separated region 13C extending in the array direction of the metal wiring 51. The lateral separated region 13C separates the section where the display portion 14 is formed on the coating layer 13 from the section where the coating layer 13 coats the metal wiring 51 in the vicinity of the boundary 10C. Thereby, in this modification, moisture and impurity ions can be surely prevented from entering between the metal wirings 51 in the vicinity of the boundary 10C through the coating layer 13.

Figure 13:
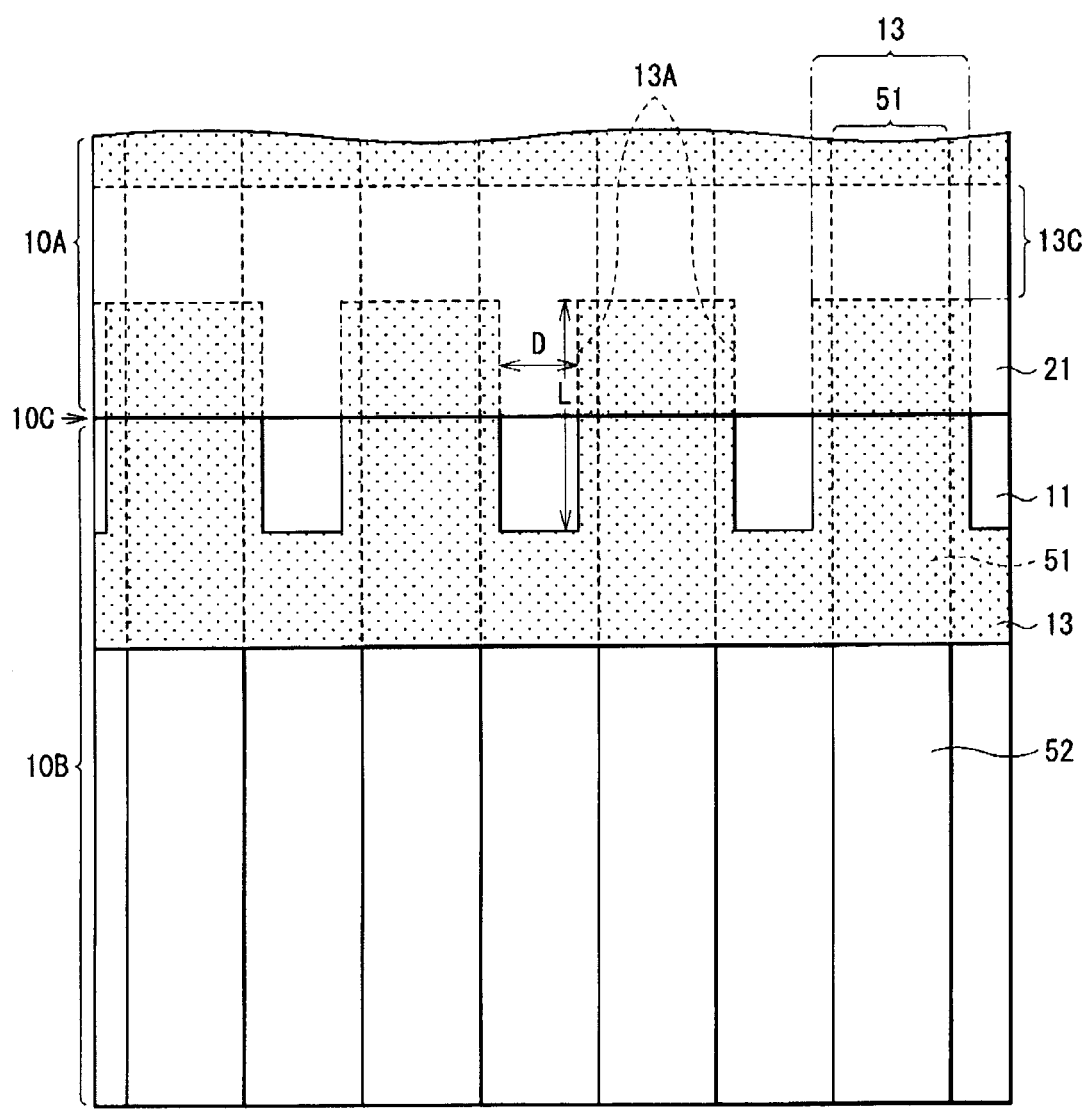
FIG. 13 is a plan view showing another modification of the display unit shown in FIG. 12.

The coating layer 13 may be provided with the aperture 13B according to the terminal 52 as shown in FIG. 12. Otherwise, as shown in FIG. 13, it is possible that the coating layer 13 coats only the metal wiring 51 and does not reach the terminal 52.

Fourth Modification

Figure 14:
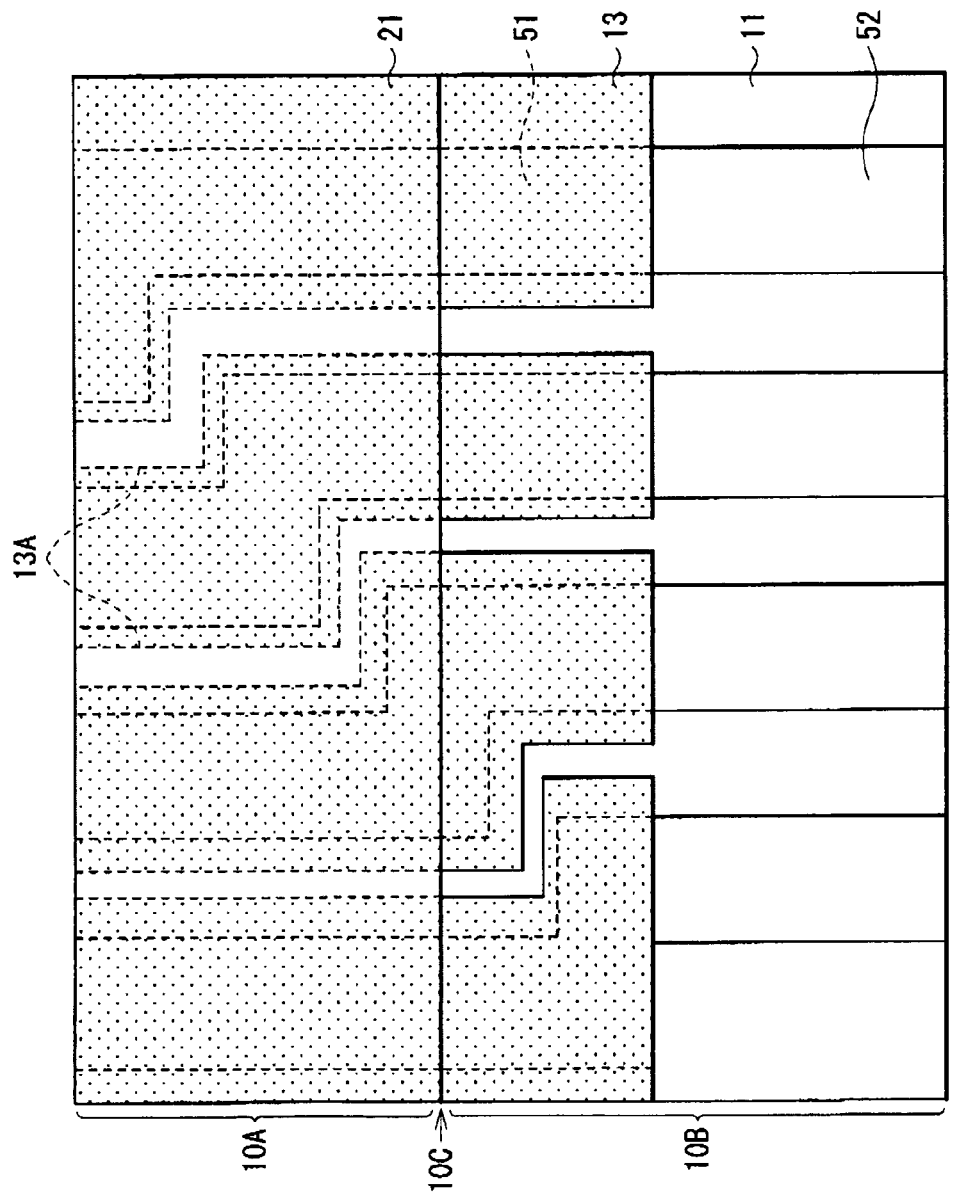
FIG. 14 is a plan view showing an enlarged part in the vicinity of a boundary of a display unit according to a fourth modification of the invention.

FIG. 14 shows a planar structure in the vicinity of the boundary 10C of a display unit according to the fourth modification of the invention. In the display unit, the metal wiring 51 is bent in the vicinity of the boundary 10C. The inter-wiring separated region 13A in the bending shape corresponding to the metal wiring 51 is provided in the coating layer 13 as well. In this modification, effects similar to those of the foregoing first modification can be obtained.

Second Embodiment

Figure 15:
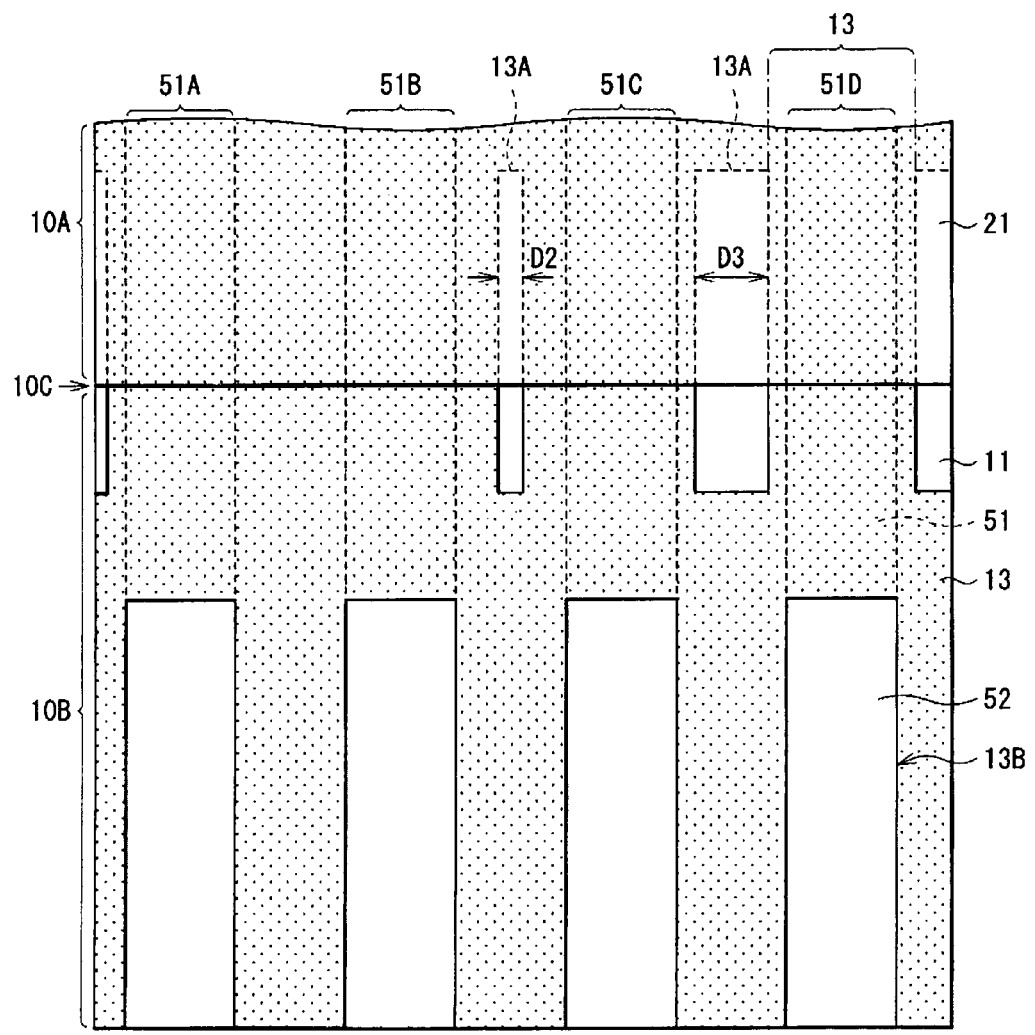
FIG. 15 is a plan view showing an enlarged part in the vicinity of a boundary of a display unit according to a second embodiment of the invention.

FIG. 15 shows a planar structure in the vicinity of the boundary 10C of a display unit according to a second embodiment of the invention. The display unit has the same structure as that of the foregoing second modification, except that the width D of the inter-wiring separated region 13A is changed according to the electric potential difference between the metal wirings 51 adjacent to each other with the inter-wiring separated region 13A in between. The method of manufacturing the display unit, the action thereof, and the effects thereof are similar to those of the second modification. Therefore, the description will be given by attaching the same symbols to the corresponding elements.

For example, when four metal wirings 51A, 51B, 51C, and 51D are provided, it is possible to set the distance D1 to 0, that is, to omit the inter-wiring separated region 13A in the case that the electric potential difference V1 between the metal wirings 51A and 51B is extremely small. Thereby, the flatness of the coating layer 13 can be improved between the metal wirings 51 with a low risk of corrosion. When the electric potential difference V2 between the metal wirings 51B and 51C is not very large, the distance D2 may be narrow. When the electric potential difference V3 between the metal wirings 51C and 51D is extremely large, the distance D3 is desirably large.

As above, in this embodiment, the width D of the inter-wiring separated region 13A is changed according to the electric potential difference between the metal wirings 51 adjacent to each other with the inter-wiring separated region 13A in between. Therefore, the flatness of the coating layer 13 can be maintained between the metal wirings 51 with a low risk of corrosion. Meanwhile, for the metal wiring 51 with a high risk of corrosion, the entering of moisture and impurity ions can be surely prevented, and the reliability of the display unit can be further improved.

Third Embodiment

Figure 16:
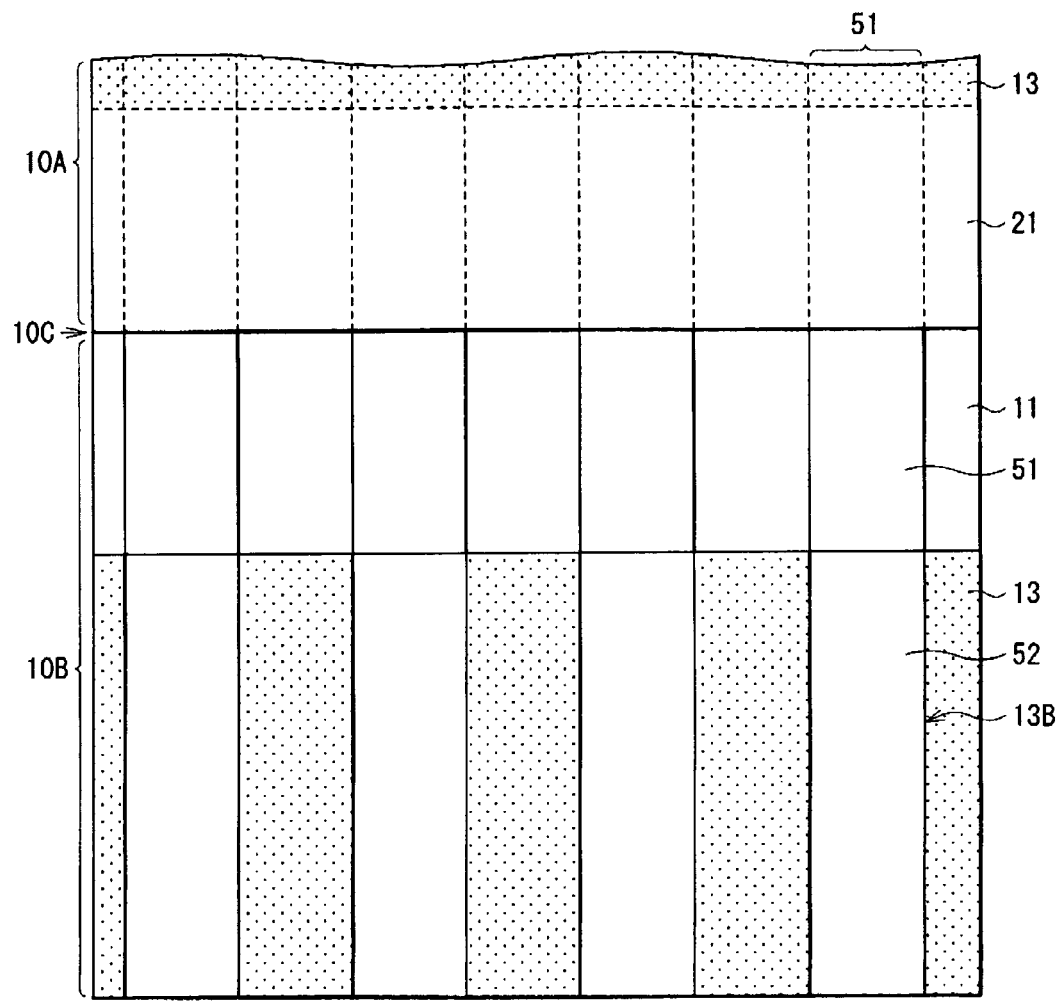
FIG. 16 is a plan view showing an enlarged part in the vicinity of a boundary of a display unit according to a third embodiment of the invention.

FIG. 16 shows a planar structure in the vicinity of the boundary 10C of a display unit according to a third embodiment of the invention. The display unit has a structure similar to that of the foregoing third modification, except that the plurality of metal wirings 51 are coated with the coating layer 13 on the terminal region 10B side rather than the boundary 10C, and can be manufactured by a similar manufacturing method.

In this display unit, light is generated and extracted from the sealing panel 20 side in the same manner as in the first embodiment. Here, the plurality of metal wirings 51 are coated with the coating layer 13 on the terminal region 10B side rather than the boundary 10C. Therefore, moisture and impurity ions are prevented from entering from the boundary 10C into the bonding region 10A through the coating layer 13.

As above, in this embodiment, the plurality of metal wirings 51 is coated with the coating layer 13 on the terminal region 10B side rather than the boundary 10C between the terminal region 10B and the bonding region 10A. Therefore, moisture and impurity ions are prevented from entering from the boundary 10C into the bonding region 10A through the coating layer 13. As a result, corrosion of the metal wiring 51 can be prevented, and the major troubles that the pixels are not lit due to short circuiting of the metal wiring 51 and basic performance is damaged can be prevented. As a result, the reliability of the display unit can be largely improved. Hereinafter, a further description will be given of a specific example of the invention.

Example

A display unit was fabricated in the same manner as in the foregoing first embodiment. The metal wiring 51 was made of aluminum (Al), and the coating layer 13 was made of polyimide. The planar shape of the coating layer 13 was similar to that of Modification 3 in FIG. 12. The inter-wiring separated region 13A was provided between the adjacent metal wirings 51, so that the inorganic insulating film 40 made of silicon nitride (SiN$_x$) was contacted with the driving substrate 11 made of glass. The width D of the inter-wiring separated region 13A was 10 μm. The obtained display unit was operated for about 1000 hours in the high temperature of 40 deg C. and the high humidity environment of 95%. After that, the metal wiring 51 was observed by an optical microscope. The result is shown in FIG. 17.

Figure 18:
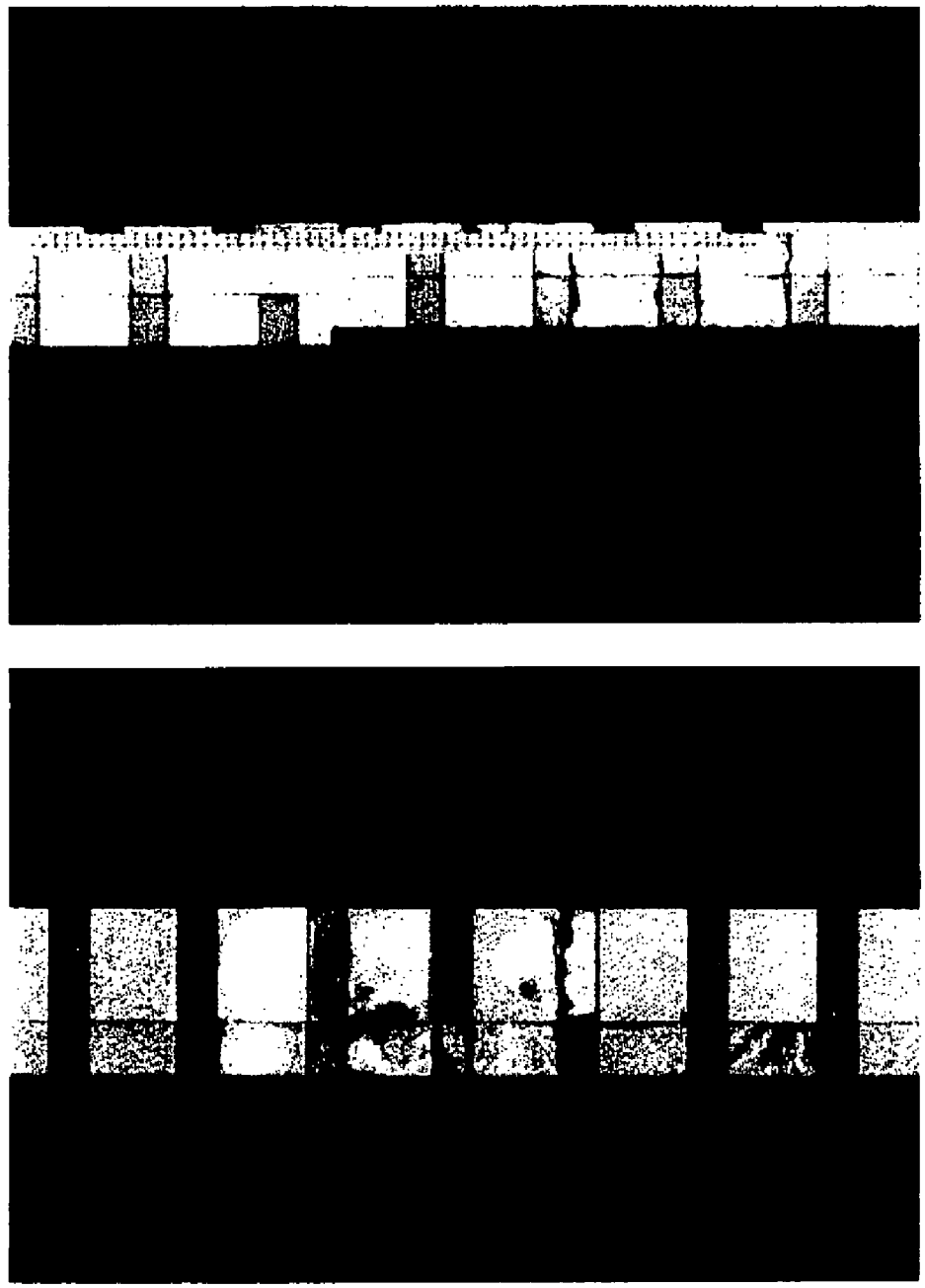
FIG. 18 is a photograph showing a result of a comparative example.
Figure 19:
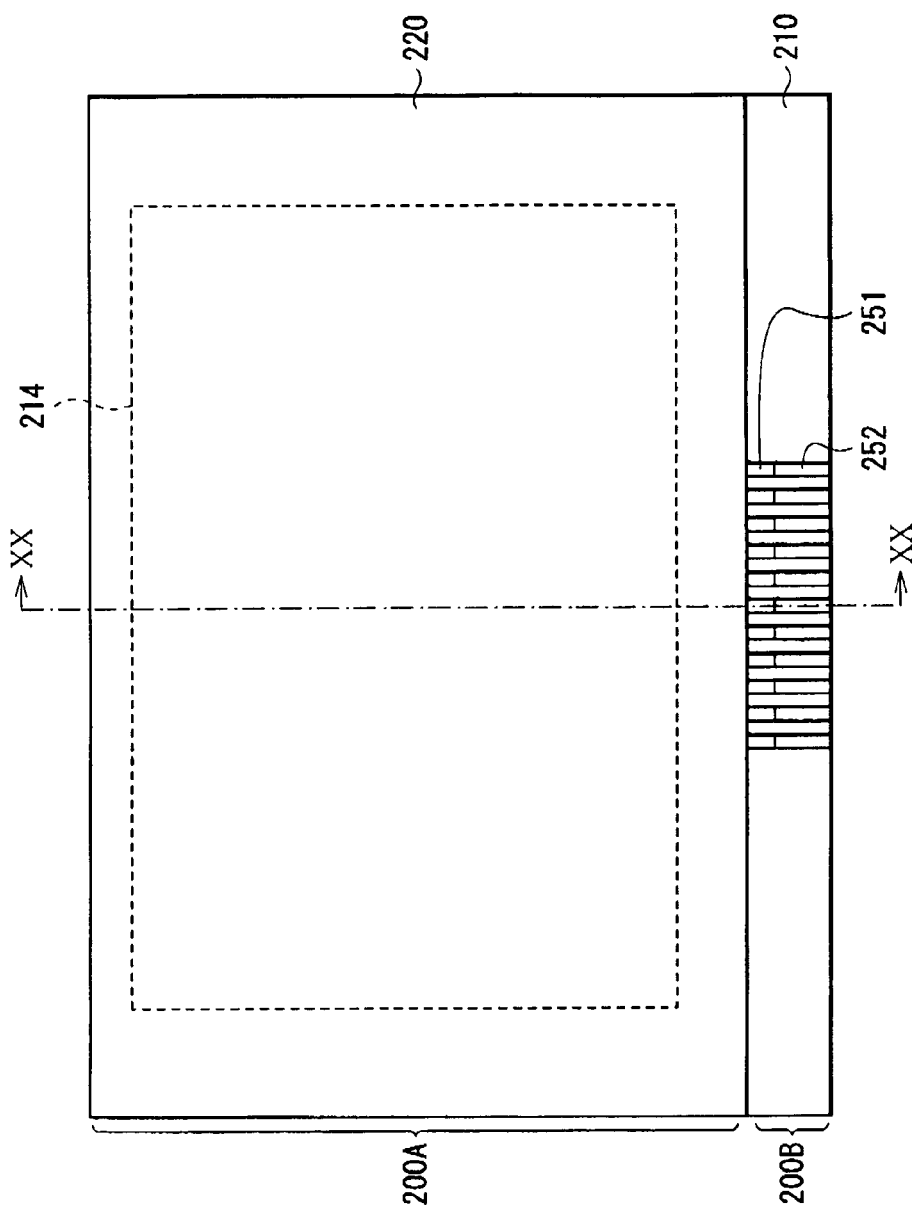
FIG. 19 is a plan view showing a schematic structure of a display unit of related art.
Figure 20:
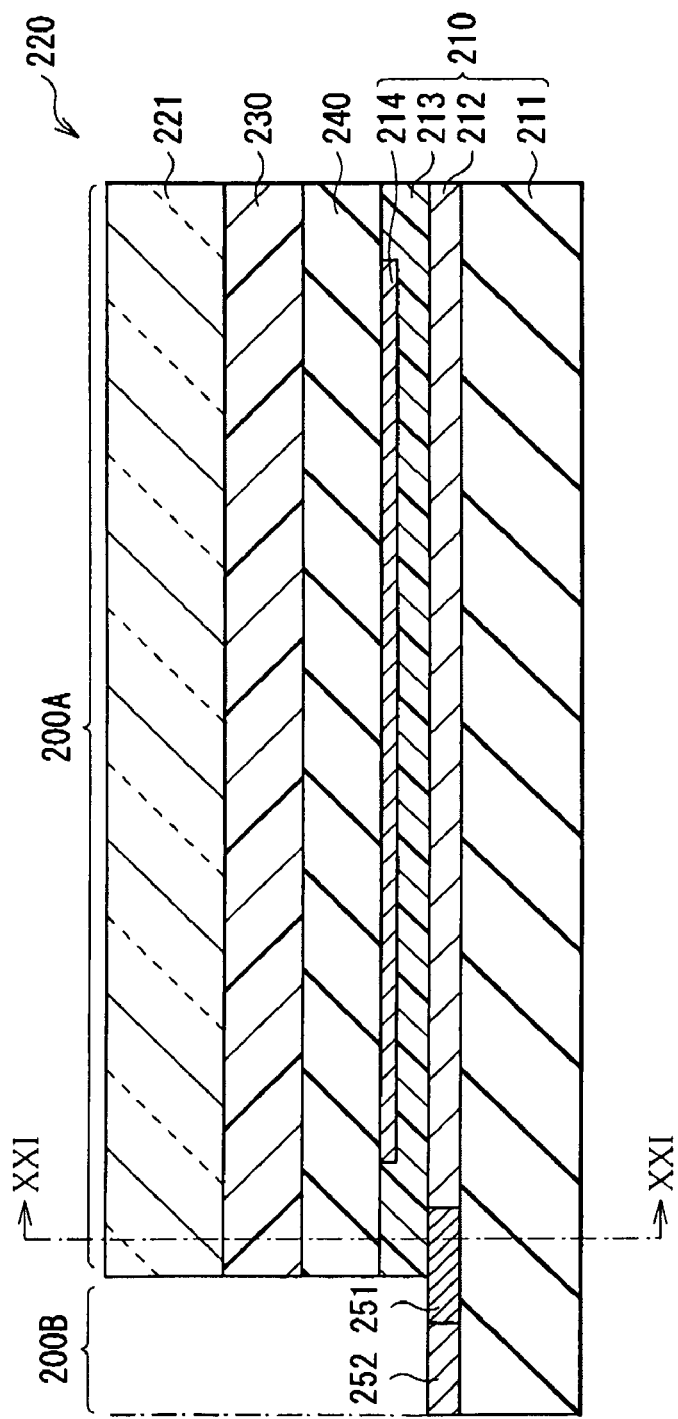
FIG. 20 is a cross section taken along line XIX-XIX of FIG. 19.
Figure 21:
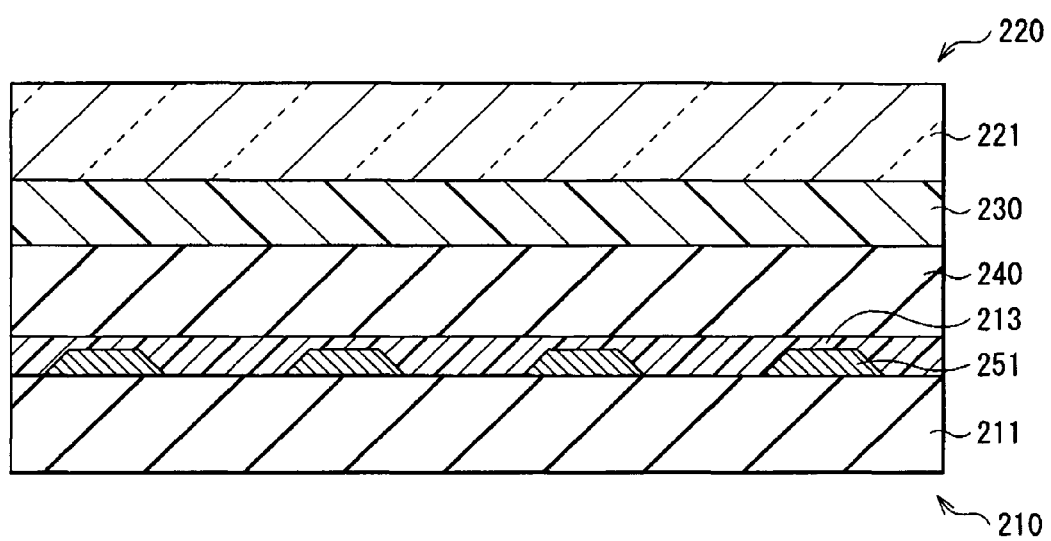
FIG. 21 is a cross section taken along line XXI-XXI of FIG. 20.

As a comparative example relative to this example, a display unit was fabricated in the same manner as in this example, except that the metal wiring was coated with a continuous coating layer in the bonding region. The obtained display unit was also operated for about 1000 hours in the high temperature of 40 deg C. and the high humidity environment of 95%. After that, the metal wiring was observed by the optical microscope. The result is shown in FIG. 18.

Figure 17:
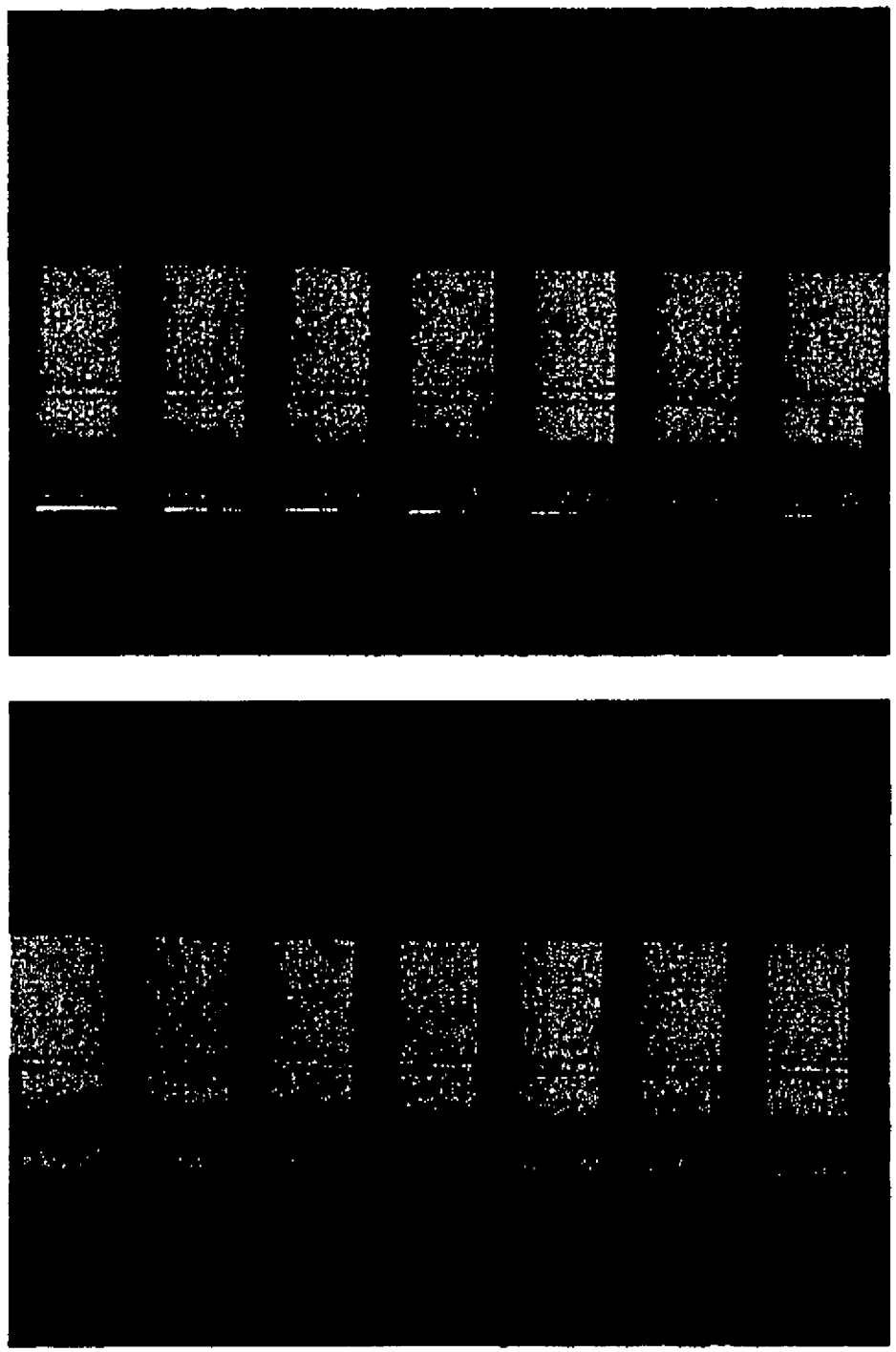
FIG. 17 is a photograph showing a result of an example of the invention.

As evidenced by FIG. 17, according to the example, extremely slight corrosion of the metal wiring 51 was observed. Meanwhile, in the comparative example, it was recognized that corrosion of the metal wiring had largely progressed. That is, it was found that when the coating layer 13 in the bonding region 10A had the inter-wiring separated region 13A between the metal wirings 51, corrosion of the metal wiring 51 could be suppressed.

While the invention has been described with reference to the embodiments, the invention is not limited to the foregoing embodiments, and various modifications may be made. For example, in the foregoing respective embodiments, the case in which the plurality of metal wirings 51 is arranged at equal intervals has been described. However, the plurality of metal wirings 51 may be arranged at different intervals. In that case, the width D of the inter-wiring separated region 13A may vary according to the interval between the metal wirings 51.

Further, in the foregoing second embodiment, it is possible that the plurality of metal wirings 51 is arranged at different intervals, and the width D of the inter-wiring separated region 13A varies according to both the interval between the metal wirings 51 and the electric potential difference.

Furthermore, for example, the material, the thickness, the film-forming method, and the film-forming conditions of each layer are not limited to those described in the foregoing embodiments, but other materials, other thicknesses, other film-forming methods, and other film-forming conditions may be adopted.

In addition, in the foregoing embodiments, the structures of the organic light-emitting devices 110R, 110B, and 110G are described with specific examples. However, it is not always necessary to provide all layers, and other layers may be further provided.

Furthermore, in the foregoing embodiments, the case in which the driving panel 10, the inorganic insulating film 40 and the sealing panel 20 are bonded with the adhesive layer 30 in between over the whole area has been described. However, the invention also can be applied to the case in which the adhesive layer 30 is formed only on part of the driving panel 10 and the sealing panel 20, such as the case in which the adhesive layer is formed on only the peripheral section of the driving panel 10 and the driving panel 10 and the sealing panel 20 are bonded.

In addition, the invention can be applied to a display unit using other display device, such as inorganic electroluminescence device, a liquid crystal display device, an electrodeposition display device, and an electrochromic display device, in addition to the display unit using the organic light-emitting device.

It should be understood by those skilled in the art that various modifications, combinations, subcombinations and alternations may occur depending on design requirements and other factors insofar as they are within the scope of the appended claims or the equivalents thereof.

What is claimed is:

1. A display unit comprising:
   a driving panel including a driving substrate having a bonding region and a terminal region forming a common boundary therebetween, a circuit section disposed on the driving substrate in the bonding region, a plurality of spaced-apart metal wirings disposed on the driving substrate in a common plane with the circuit section, connected to the circuit section and extending from the circuit section into the terminal region, a coating layer covering the circuit section and the plurality of metal wirings with the plurality of metal wirings being covered at least within the bonding region and a display portion disposed on the coating layer opposite the circuit section and within the bonding region;
   an insulating film disposed on the display portion and at least a peripheral portion of the coating layer within the bonding region; and a sealing panel disposed on and bonded to the insulating film in the bonding region with an adhesive layer in between, wherein, at least from the common boundary and extending partially inwardly into the bonding region, an inter-wiring separated region is formed between the spaced-apart metal wirings such that the insulating film contacts the driving substrate in each of the inter-wiring separated regions.

2. The display unit according to claim 1, wherein the coating layer is made of an organic material.

3. The display unit according to claim 1, wherein the coating layer is made of a photosensitive material.

4. The display unit according to claim 1, wherein each of the inter-wiring separated regions is provided in the terminal region beyond the common boundary.

5. The display unit according to claim 1, wherein coating layer sections of the coating layer coat a top face and a side face of the plurality of metal wirings extending at least partially inwardly from the common boundary and into the bonding region, the coating layer sections being spaced apart from one another.

6. The display unit according to claim 1, wherein insulating film is inorganic and the driving substrate is made of an inorganic material including glass.

7. The display unit according to claim 1, wherein the inter-wiring separated region has a width and the width of the inter-wiring separated region of the coating layer varies corresponding to at least one of a distance between two metal wirings adjacent to each other with the inter-wiring separated region in between, and an electric potential difference thereof.

8. The display unit according to claim 1, wherein the display device is an organic light-emitting device having a structure in which a first electrode, an organic layer including a light-emitting layer, and a second electrode are sequentially layered from the driving substrate side, and extracting light generated in the light-emitting layer from the second electrode side.

* * * * *